United States Patent [19]
Inazawa et al.

[11] Patent Number: 5,772,833
[45] Date of Patent: Jun. 30, 1998

[54] PLASMA ETCHING APPARATUS

[75] Inventors: Koichiro Inazawa; Yoshio Ishikawa; Takashi Asakawa; Masato Hiratsuka; Nobuyuki Okayama, all of Tokyo, Japan

[73] Assignee: Tokyo Electron Limited, Japan

[21] Appl. No.: 341,524

[22] Filed: Nov. 17, 1994

[30] Foreign Application Priority Data

Nov. 20, 1993 [JP] Japan .................................. 5-314096

[51] Int. Cl.⁶ .................................................. H01L 21/02
[52] U.S. Cl. .......................... 156/345 P; 156/345 MG; 156/345 PT; 156/345 PC; 156/345 PW; 156/345 WH; 156/345 MC; 216/67
[58] Field of Search .............. 156/643.1, 646.4, 156/345, 345 P, 345 PC, 345 PW, 345 WH, 345 MC; 216/67

[56] References Cited

U.S. PATENT DOCUMENTS

| | | |
|---|---|---|
| 4,333,814 | 6/1982 | Kuyel .................................... 216/67 |
| 4,439,261 | 3/1984 | Pavone et al. ..................... 156/345 P |
| 4,693,777 | 9/1987 | Hazano et al. ................... 156/345 PC |
| 4,713,141 | 12/1987 | Tsang . |
| 4,816,638 | 3/1989 | Ukai et al. ....................... 156/345 PC |
| 4,842,683 | 6/1989 | Cheng et al. ............................ 216/67 |
| 4,963,713 | 10/1990 | Horiuchi et al. ....................... 156/345 |
| 5,015,331 | 5/1991 | Powell ............................... 156/643.1 |
| 5,110,408 | 5/1992 | Fujii et al. . |
| 5,202,291 | 4/1993 | Charvat et al. . |
| 5,259,923 | 11/1993 | Hori et al. ......................... 156/643.1 |
| 5,269,881 | 12/1993 | Sekiya et al. ...................... 156/345 P |
| 5,271,788 | 12/1993 | Hagegawa et al. ............ 156/345 MG |
| 5,310,453 | 5/1994 | Fukasawa et al. ................. 156/643.1 |
| 5,366,585 | 11/1994 | Robertson et al. ..................... 216/67 |
| 5,368,684 | 11/1994 | Ishikawa et al. .................. 156/643.1 |
| 5,447,595 | 9/1995 | Nakagawa ............................... 216/67 |

Primary Examiner—T. Tung
Attorney, Agent, or Firm—Graham & James LLP

[57] ABSTRACT

The present invention relates to a plasma etching method and a plasma etching apparatus, and more particularly to a plasma etching method and a plasma etching apparatus in which the selection ration is enhanced by improving trench side-wall protecting effect.

14 Claims, 2 Drawing Sheets

$$\text{RATIO} = \frac{\text{AN AREA OF ANODE ELECTRODE INSIDE OF CHAMBER}}{\text{AN AREA OF CATHODE ELECTRODE INSIDE OF CHAMBER}}$$

5,772,833

PLASMA ETCHING APPARATUS

BACKGROUND OF THE INVENTION

1. Field of the Invention

The present invention relates to a plasma etching method and a plasma etching apparatus, and more particularly to a plasma etching method and a plasma etching apparatus in which the selection ratio is enhanced by improving trench side-wall protecting effect.

2. Description of the Prior Art

Semiconductor elements have recently been tended toward larger scale integration, and the need for an increased number of deposition layers and further miniaturization of the wiring has been dramatic. As multi-deposited layers have been made thinner by the semiconductor elements having larger scale integration, the processed width of each multi-deposited layer has become smaller and the dimensional accuracy of wiring has become higher. The wiring is formed in such a way that the to-be-processed surface of each layer is covered with a resist mask or the like having a predetermined pattern, and trenches are formed by etching the material exposed at the openings of the resist mask which are not covered with the pattern. With the normal etching process, an etching gas is changed to plasma to produce active species such as radicals. The active species react with the material of the layer at each opening of the resist mask, and volatile reaction products are produced. The etched material of the layer at each opening is removed by volatilizing the volatile reaction products from each opening.

The active species in the plasma equally react on the materials of the bottom of each trench formed in the layer and the mask at the side walls of the each trench. Thus, it is difficult to etch only the bottom of the trench. Further, since the material of the to-be-etched portions and the material of the other portions of the layer, such as the underlying layer or the mask, are different from each other, the reaction products produced at these portions are also different from each other and have different volatilities. Due to the difference of volatilities, the etching speeds also differ at these portions. The etching speed rates between these portions define etching selection ratios of the respective materials. For a constant etching speed of the mask at the side walls of the trench, the etching selection ratio at the bottom of the trench becomes larger when the etching speed thereat becomes larger. In consequence, the bottom of the trench can be etched anisotropically.

Even when an etching gas having a high selection ratio is selected to form wiring by the plasma etching process, chemical reaction produced by radical species is chiefly performed because the etching species are radicals in the plasma, and the bottom face and the side walls of the layer are etched uniformly, i.e., etched isotropically. This produces undercut in the side walls, deteriorating the electrical characteristics of the wiring. Fine process of more than 1 MDRAM makes the wiring width small and the electrical characteristics of the wiring are remarkably deteriorated due to the undercut in the side walls. Thus, such undercut must be suppressed to a minimum value. A reactive ion etching process which uses ion species as etching species in plasma has been developed in place of the plasma etching process which uses radical species as etching species in plasma. In the reactive ion etching process, ion species are allowed to hit against a to-be-processed article due to the potential difference between the plasma potential and the potential of the to-be-processed article. The shock of the collision of the ion species with the bottom of the trench activates the material of the bottom of the trench so that the bottom of the trench is preferentially etched. Since ion species have etching orientation, so-called anisotropic etching, which etches the bottom of the trench before its side walls are etched, can be performed, and undercut of the side walls is suppressed.

With these etching processes, the mask is also etched. When the mask is a resist mask made of an organic compound or the like, hydrocarbon-based reaction products are deposited on the side walls of each opening of the layer and polymerized as is in the case of the plasma etching process. The polymerized layer has a side-wall protecting effect for protecting the side walls of each trench. In other words, the side-wall protecting effect prevents the side walls from being etched by radical species, and vertical side walls are formed by the reactive ion etching process in cooperation with the anisotropic etching process. When the width of the processed line is less than submicron which is 4 MDRAM or more, the problems of the pattern dependency and microloading arise. In order to overcome these problems, a process has been developed in which plasma is produced from an etching gas of low concentration and a magnetic field is applied to the plasma to induce an E×B drift of electrons to increase the ionization rate. This develops an anisotropic etching process occurring under low concentration of the etching gas. Further, a magnetron ion reactive etching process for improving anisotropic etching has been developed which controls chemical reaction produced by radical species to a minimum value by lowering the temperature of electrodes and forms the side walls vertically.

As the aspect ratio increases by using the conventional magnetron ion reactive etching process, as in the recent trend, the ion species must be directed in the same direction as the direction toward the openings. Etching selectivity is lowered when the intensity of the electric field increases. Thus, it has become more difficult to enhance the etching selectivity and form vertical walls of wiring. When, for example, a gate electrode is formed by etching a silicon layer, the processed width is very small. Further, the processing accuracies give a great undesirable effect to the electrical characteristics of the gate electrode. The gate oxide layer which is a silicon oxide layer and also is an underlying layer is thinner than 100 angstroms. Thus, it is necessary to elevate the selection ratios of the polysilicon layer and the silicon oxide layer as highly as possible. However, it is extremely difficult to increase both the selection ratio and the anisotropy so as to form accurate vertical walls. In doing so, various measures including the lowering of the temperature of electrodes as described above must be taken, leading to a high manufacturing and operating costs of the apparatuses.

SUMMARY OF THE INVENTION

In the process of checking how to increase the etching selection ratios and anisotropy, the inventors of the present invention found a side-wall protecting effect which could not be explained by the known side-wall protecting effect of the resist mask under certain conditions. The inventors of the present invention analyzed the chemical components of the side walls by assuming that some material other than the resist mask contribute to the new side-wall protecting effect and found that there are other specific impurities than the material of the resist mask in the side walls and the bottoms of the trenches and confirmed that the impurities are metal components which form the process chamber. After various studies of how to obtain the required contents of the impurities and means for maintaining the impurity contents, it was found that the vertical side walls are formed more accurately and the selection ratios of the underlying layer and the like are increased by adding a predetermined amount of such metal components to the to-be-processed article. It was also found that the predetermined amounts of the impurities can be obtained by setting the surface ratio between the cathode electrode and the anode electrode to a predetermined value.

The present invention was made under such circumstances.

According to one aspect of the present invention, there is provided a plasma etching method comprising the steps of producing plasma of an etching gas in a process chamber made of a metal such as aluminum, metal oxide such as aluminum oxide and/or metal nitride and performing an ion reactive etching process performed in the process chamber on a to-be-processed article by means of ion species having one polarity of electric charges in the plasma and further comprising the steps of causing ion species having the other polarity of electric charges in the plasma to hit against the inner wall of the process chamber to sputter metal atoms and causing not less than $10^{14}$ of the metal atoms/cm$^2$ to be deposited on the surface of the to-be-processed article.

According to another aspect of the present invention, there is provided a plasma etching apparatus which comprises a vacuum container made of a metal such as aluminum, metal oxide such as aluminum oxide and/or metal nitride such as aluminum nitride, a cathode electrode provided in the vacuum container chamber and supporting a to-be-processed article, the cathode electrode dividing the interior of the vacuum container into a process chamber and a transferring chamber, an anode electrode defined by the portion of the vacuum container which faces the process chamber, means for introducing an etching gas into the process chamber and means for applying a high frequency electric power to the cathode electrode and producing plasma of the etching gas between the cathode electrode and the anode electrode to allow reactive ions in the plasma to etch the to-be-processed article supported by the cathode electrode and wherein the area ratio of the effective area of the inner surface of the anode electrode to the area of the surface of the cathode electrode is not more than 3.5.

When an etching gas is changed to plasma in the process chamber made of a metal such as aluminum, metal oxide such as aluminum oxide and metal nitrogen such as aluminum nitride in the first aspect of the present invention, ion species having one polarity of electric charges in the plasma hit against the surface of a to-be-processed article and ion assist etching is performed at their opening portions, and ion species having the other polarity of electric charges in the plasma hit against the inner surface of the metallic process chamber and sputters metal atoms therefrom. The sputtered metal atoms fly in the process chamber and are deposited on the whole surfaces (including the side walls and the bottoms) of the opening portions of the to-be-processed article which are being etched. When the deposit density of the metal atoms has come to a value not less than $10^{14}$ atoms/cm$^2$, the metal atoms act as a protecting layer of the respective opening portion. The etching of the side walls of each trench is suppressed and the bottom of the trench is etched preferentially so that the vertical walls are formed accurately in the opening portion. When the etching process arrives at the underlying layer, the metal atoms protect the underlying layer. The selection ratio of the underlying layer is further enhanced to effectively protect the underlying layer from being over-etched.

Upon applying a high frequency electric power to the cathode electrode in the process chamber made of a metal such as aluminum, metal oxide such as aluminum oxide and/or metal nitride such as aluminum nitride, plasma of an etching gas is produced between the cathode electrode and the anode electrode. Positive ion species in the plasma hit against the to-be-processed article due to the potential difference between the plasma potential and the potential of the cathode electrode, whereby ion assist etching is performed at the openings of the to-be-processed article by the reactive ions. Since the area ratio $S_2/S_1$, of the above-mentioned area $S_2$ of the anode electrode to the above-mentioned area $S_1$ of the cathode electrode is set to a value of not more than 3.5, negative ion species in the plasma strongly hit against the inner surface of the anode electrode to sputter metal atoms therefrom. The metal atoms fly in the process chamber and are deposited on the surface of the to-be-processed article. The attached metal atoms prevent the side walls of the openings from being etched by the radical species and form accurately vertical side walls. When the etching arrives at the underlying layer, the metal atoms protect the underlying layer and the selection ratio of the underlying layer is further enhanced. In this way, the underlying layer is effectively prevented from being over-etched.

DETAILED DESCRIPTION OF THE PREFERRED EMBODIMENTS

Figure 1:
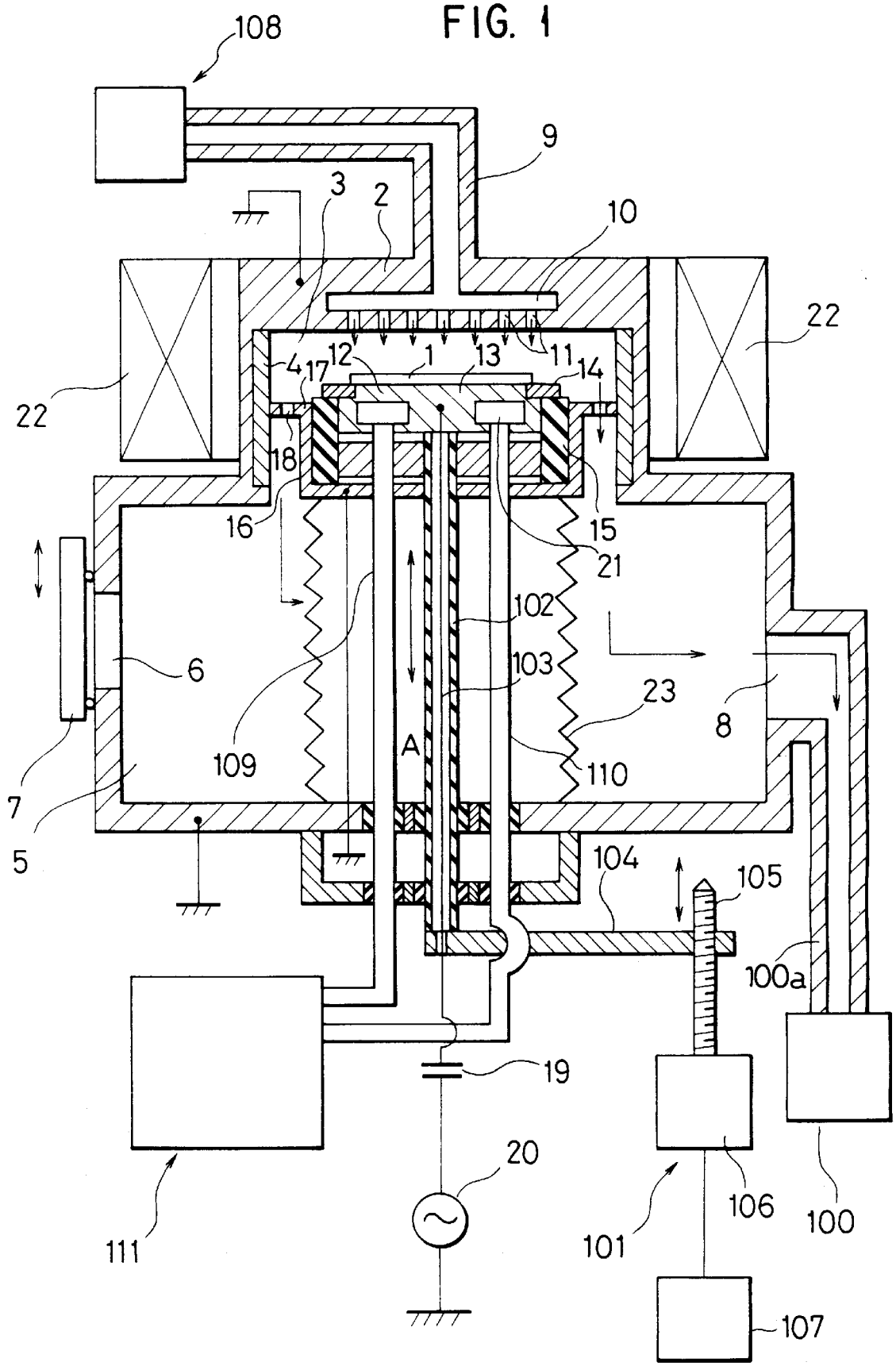
FIG. 1 is a general perspective view of a plasma etching apparatus according to one embodiment of the present invention.
Figure 2:
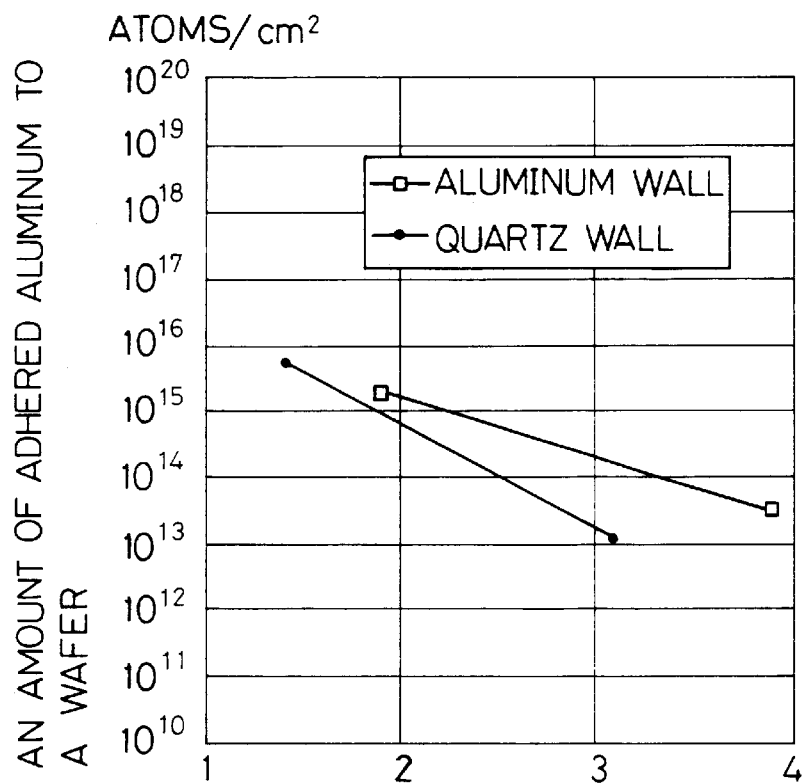
FIG. 2 is a graph showing the relationship between the area ratio of the area of an anode electrode to the area of a cathode electrode and the number/cm$^2$ of aluminum atoms.
Figure 3:
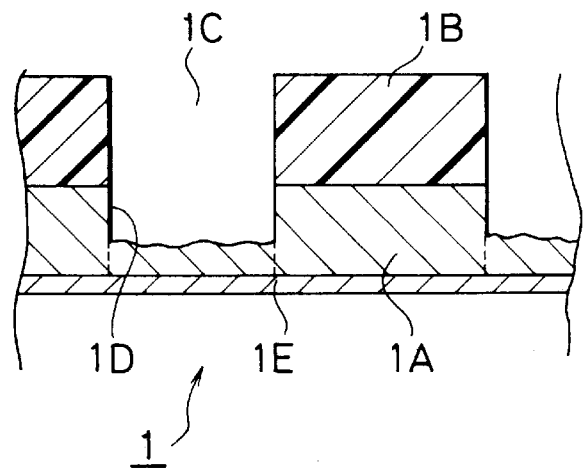
FIG. 3 is a general cross-sectional view of the main part of a semiconductor wafer etched by the plasma etching apparatus shown in FIG. 1.

The present invention will be described by way of the preferred embodiments with reference to FIGS. 1 to 3. Before describing a plasma etching method according to the present invention, an embodiment of a plasma etching apparatus according to the present invention preferably used in the plasma etching method will be described with reference to FIG. 1. FIG. 1 shows a magnetron ion reactive etching apparatus which is used, for example, for etching a polysilicon layer to form a gate electrode.

As shown in FIG. 1, the plasma etching apparatus according to this embodiment has a vacuum container 2 for etching a semiconductor wafer 1 or the like. The vacuum container 2 is hermetically sealed so as to be evacuated and is made of aluminum with at least part of its inner surface formed with aluminum oxide and/or aluminum nitride. The upper portion of the vacuum container 2 forms a process chamber 3 for etching the semiconductor wafer 1. On the inner peripheral surface of the vacuum container 2 is detachably provided a cylindrical member 4 made of aluminum with at least part of its inner surface formed with aluminum oxide and/or aluminum nitride. The cylindrical member 4, which is exhausted by the sputtering of ion species in plasma while etching the semiconductor wafer 1, can be cleaned after being removed or replaced by a new one. The lower portion of the vacuum container 2 which is disposed under the process chamber 3 forms a transferring section 5. In a portion of a side wall of the transporting section 5 is formed an entrance/exit 6 for transferring a semiconductor wafer 1 in and out of the transporting section 5. The entrance/exit 6 is connected through a gate valve 7 to a preliminary vacuum chamber (not shown) which can be evacuated. By opening the gate valve 7, the semiconductor wafer 1 can be moved between the transporting section 5 and the preliminary vacuum chamber. In a portion of the other side wall of the transporting section 5 is formed an evacuating port 8 connected by a pipe 100a to a vacuum pump assembly 100 such as a combination of a turbomolecular pump and a rotary pump arranged in series therewith, so that the process chamber 3 is evacuated to a pressure of $1 \times 10^{-1}$ Torr to $1 \times 10^{-8}$ Torr, for example. A process gas (an etching gas) such as a chlorine gas and an inert gas such as a nitrogen gas are introduced from a process gas source 108 into a hollow chamber 10 formed in the upper wall of the vacuum container 2 through a process gas supplying pipe 9 and is uniformly jetted on the whole surface of the semiconductor wafer 1 in the process chamber 3, through a plurality of supplying holes 11 opened to the interior of the process chamber 3.

A loading table 12 for holding the semiconductor wafer 1 is provided in the vacuum container 2 and is lifted and lowered by a lift mechanism 101 between a lower position or a first position which will be described later and an upper position or a second position which will be also described later in the vacuum container 2 as shown by a double headed arrow A.

The lift mechanism 101 comprises a tube 102 made of an electrically insulating material and extending vertically through the vacuum container 2, a horizontal connecting member 104 having one end fixed to one end of the tube 102, a vertical ball screw 105 threadably engaging the other end of the connecting member 104, a driving unit 106 such as a motor for rotating the ball screw 105 in both directions and a controlling unit 107 for controlling the rotational number and the rotational direction of the driving unit 106.

The table 102 has the upper end fixed to the loading tube 12 and extends through the bottom wall of the vacuum container 2. A vacuum seal (not shown) such as a magnetic seal is provided between the tube 102 and the bottom wall of the vacuum container 2 to separate the vacuum atmosphere in the process chamber 3 from the outer atmosphere.

When the loading table 12 is at the second position as shown in FIG. 1, the loading table 12 divides the vacuum container 2 into the process chamber 3 and the transferring section 5.

The first position is fixed and is at a level at which the lowered loading table 12 is at the level of the entrance/exit 6 so that a semiconductor wafer 1 is transferred through the entrance/exit 6 by means of a transfer arm (not shown) by opening the gate valve 7. The second position is selected according to the kind and size of the to-be-processed article and the process performed on the article. The data on the kind, size and process are inputted to the controlling unit 107, and the loading table on which the semiconductor wafer 1 is mounted is lifted by the lift mechanism 101 to the selected second position in accordance with the control value given by the controlling unit 107. More specifically, the second position is selected so as to provide the required area ratio of the effective area of the anode to the area of the cathode as will be described in detail later.

The loading table 12 comprises a first electrode 13 on which the semiconductor wafer 1 is loaded and to which a high frequency electric power is applied, an electrostatic chuck 14 provided on the peripheral edge of the upper surface of the first electrode 13, for attracting and fixing the semiconductor wafer 1 to the first electrode 13 by a Coulomb force, a supporting member 16 for supporting the first electrode 13 and the electrostatic chuck 14 through an electrically insulating member 15 and a ring member 17 made of aluminum oxide or the like and/or metal nitride and extending along the whole length of the inner periphery of the process chamber 3. In the whole circumference of the ring member 17 are formed a plurality of holes 18 through which the gas is introduced from the process chamber 3 to the transporting section 5.

The ceiling and the side wall of the process chamber 3 constitute a grounded second electrode. The first electrode 13 of the loading table 12 is connected to a high frequency power source 20 for supplying an electric power having a radio frequency of 1 MHz to 100 MHz to the cathode electrode 13 through a power source line 103 and a blocking condenser 19 by which the first electrode 13 is negatively self-biased. In other words, the portion of the vacuum container 2 which faces the process chamber 3 includes a grounded anode electrode, and the loading table 12 constitutes a cathode electrode. The semiconductor wafer 1 is cathode-connected. A predetermined amount of the process gas (a chlorine gas) is introduced into the evacuated process chamber 3 to maintain a predetermined degree of vacuum in the process chamber 3 as described above, and a high frequency electric power is applied to the first electrode 13 of the loading table 12. Vacuum discharge occurs due to the potential difference between the anode electrode and the cathode 13 and plasma of the chlorine gas is produced. The electrons in the plasma preferentially arrive at the surface of the semiconductor wafer 1 over the ions in the plasma and the first electrode 13 is negatively self-biased.

The area ratio $S_2/S_1$ of the area $S_2$ of the anode electrode to the area $S_1$ of the cathode electrode can be changed by moving the loading table 12 vertically by means of the lifting mechanism 101 as was already described. The area $S_2$ of the anode electrode is the sum of the area of the ceiling, the area of the inner peripheral surface of the process chamber 3 and the area of the ring member 17 made of aluminum oxide and fixed to the peripheral portion of the loading table 12 while etching is being performed. More specifically, when a cylindrical member 4 made of a metal such as aluminum and forming a cover is detachably provided on the inner peripheral surface of the process chamber 3, the area $S_2$ of the anode electrode includes the area of the inner side wall of the cylindrical member 4. When, on the other hand, a cylindrical member 4 made of an electrically insulating material such as quartz is provided on the inner peripheral surface of the process chamber 3, the area $S_2$ does not include the area of the inner wall of the cylindrical member 4. The anode electrode is sputtered by negative ion species in the plasma during etching. The intensity of the sputtering depends on the area ratio $S_2/S_1$. The larger the area ratio, the stronger the intensity of the sputtering.

Metal atoms or aluminum atoms are driven out of the inner peripheral surface of the anode electrode by causing negative ion species to hit thereagainst. This embodiment is characterized in that it positively uses the sputtered aluminum atoms. The amount of the sputtered aluminum atoms is increased to a value of not less than a predetermined value by adjusting the area ratio $S_2/S_1$, and the produced aluminum atoms are used as a protecting layer upon etching the semiconductor wafer 1. FIG. 2 illustrates a relationship between the area ratios ($S_2/S_1$) and the amount of the sputtered aluminum atoms. This relation indicates that the amount of aluminum increases as the area ratio $S_2/S_1$ decreases. At the area ratio $S_2/S_1$ not more than 3.5, more than the predetermined amount of aluminum atoms can be obtained. When the area ratio $S_2/S_1$ is set to a value of not more than 3.5, a predetermined amount (number) of aluminum atoms is driven out of the inner peripheral surface of the anode, and $10^{14}$ or more atoms/cm$^2$ are deposited on the semiconductor wafer 1. This amount of aluminum atoms can increase the selection ratio between the polysilicon layer 1A of the semiconductor wafer 1 and the resist mask 1B. Since the portions of the polysilicon layer 1A at opening portions 1C are etched at the improved selection ratio, the side walls 1D of the etched portions of the polysilicon layer 1A are protected by the reactive products produced from the resist mask 1B and aluminum atoms so that the vertical side walls 1D can be formed accurately. Further, aluminum atoms also protect a silicon oxide layer 1E which is an underlying layer, thereby increasing the selection ratio of the polysilicon layer 1A from about 20 to about 50.

Coolant passageways 21 are formed in the first electrode 13 for conducting a cooling medium or a coolant. A coolant temperature controlling and coolant circulating unit 111 disposed outside of the vacuum container 2 is connected to the coolant passages 21 by coolant tubes 109. A coolant such as liquid nitrogen LN$_2$ supplied from the unit 111 through the coolant tubes 109 flows through the coolant passageways 21 and maintains the temperature of the cathode electrode 13 to −50° to 80°. Since the area ratio $S_2/S_1$ is set to a value of not more than 3.5 in this embodiment, a high side-wall protecting effect is maintained even at a relatively high temperature of about 20° of the first electrode 13, and the vertical side walls 1D are formed more accurately than the conventional side walls. Therefore, it is unnecessary to maintain the temperature of the first electrode 13 to an extremely low value by using liquid nitrogen. The side walls can be formed satisfactorily vertically by using cooling water.

A ring-shaped permanent magnet 22 surrounds the process chamber 3 of the container 2 and generates a horizontal magnetic field perpendicular to the vertical electric field generated between the anode electrode and the cathode electrode. The perpendicular magnetic field produced between both electrodes induces an E×B drift of the electrons in the plasma, making the density of the plasma very large. Bellows are indicated at 23 in FIG. 1.

A plasma etching method according to the present invention which uses the above-mentioned plasma etching apparatus will be described. The interior of the preliminary vacuum chamber (not shown) is evacuated to the same level as the interior of the vacuum container 2. A semiconductor wafer 1 is transferred from the preliminary vacuum chamber to the transporting chamber 5 with the gate valve 7 opened. The semiconductor wafer 1 is loaded on the loading table 12 disposed at the first position and is fixed thereto by the electrostatic chuck 14, and the gate valve 7 is closed to seal the vacuum container 2 hermetically. Then, the loading table 12 together with the semiconductor wafer 1 is lifted by the lift mechanism 101 to the second position which provides a required area $S_2/S_1$ which, for example, is not more than 3.5. In this condition, a coolant is caused to flow through the coolant passageway 21 in the cathode electrode 13 of the loading table 12 so as to maintain the temperature of the cathode electrode 13 to −50° to 80°, specifically to 20°.

Thereafter, a chlorine gas as an etching gas is supplied at a flow rate of 100 sccm from the gas supplying tube 9 to the process chamber 3 through the hollow chamber 10 and the supplying holes 11 in the upper wall of the process chamber 3. The pressure of the chlorine gas is controlled to 10 to 100 mTorr, more specifically to 50 mTorr. Under this condition, a high frequency electric power of 13.56 MHz is applied at an electric power density of 0.5 to 0.85 W/cm$^2$, more specifically 0.76 W/cm$^2$ from a high frequency electric power source 20 for providing radio frequencies ranging from 1 MHz to 200 MHz to the cathode electrode 13 of the loading table 12. The chlorine gas acts as a medium to cause vacuum discharge to occur due to the potential difference between the grounded anode electrode and the cathode electrode 13. As a result, both vertical electric field and plasma of a chlorine gas are produced. The permanent magnet 22 provided outside of the process chamber 3 generates a horizontal magnetic field which is perpendicular to the electric field in the process chamber 3 and which is also perpendicular to the plasma. The horizontal magnetic field generates an E×B drift of the electrons in the plasma, thereby increasing the ionization ratio of the plasma.

The electrons in the plasma preferentially arrive at the surface of the semiconductor wafer 1 over the ions under the action of the blocking condenser 19. The cathode electrode 13 is negatively charged and negatively self-biased. A large potential difference is generated between the plasma potential and the self-biased potential of the semiconductor wafer 1. Positive ions of chlorine in the plasma collide at right angles at a high speed with the surface of the semiconductor wafer 1 due to the potential difference, and the portions of the polysilicon layer 1A at the opening portions 1C can be etched anisotropically by reactive ions having etching orientation. Volatile reaction products such as SiCl$_4$ produced by the anisotropic etching are introduced from the process chamber 3 into the transporting section 5 through the holes 18 formed in the aluminum oxide ring member 17 of the loading table 12 and exhausted from the exhaust port 8 to the outside of the transporting section 5. At the same time, the resist mask 1B or the semiconductor wafer 1 is also etched and reaction products exhibit a side-wall protecting effect for protecting the opening portions 1C so as to form the vertical side walls 1D accurately.

Negative ions in the plasma hit against the inner peripheral wall of the anode electrode, and aluminum atoms are sputtered therefrom. The aluminum atoms fly in the process chamber 3 and arrive at the surface of the semiconductor wafer 1. Then, they are deposited thereon. As the area ratio $S_2/S_1$ is set to a value of not more than 3.5, $10^{14}$ or more of aluminum atoms/cm$^2$ are deposited on the semiconductor wafer 1 during the etching process. Such amount of attached aluminum atoms produces a remarkable side-wall protecting effect. Not only the resist mask is protected by the side-wall protecting effect but also the etching of the side walls by radical species is much suppressed. Thus, the vertical side walls can be formed more accurately than the conventional side walls. Since aluminum atoms are also deposited on the bottom of each opening 1C, the selection ratio of the silicon oxide layer 1E which is an underlying layer of the polysilicon layer 1A increases. Thus, even if the thickness of the silicon oxide layer is not more than 100 angstroms, the layer can be over-etched without loosing the predetermined function as a gate oxide layer, and residues in the opening portions are removed securely.

As explained above, according to the present invention, the area ratio $S_2/S_1$ is set to a value of not more than 3.5. Negative ion species in the plasma positively hit against the inner surface of the anode electrode to sputter aluminum atoms. Not less than $10^{14}$ sputtered aluminum atoms/cm$^2$ are deposited on the surface of the semiconductor wafer 1 to provide a sidewall protecting effect. In this way, the side walls of the opening portions can be formed much more vertically by the etching process than the conventional side walls, and the selection ratio of the polysilicon layer to the gate oxide layer can be increased. In consequence, the gate electrode formed by a polysilicon layer having excellent electric characteristics can be manufactured at a high accuracy and at a low cost.

In these embodiments, the apparatus and the method for forming a gate electrode made of polysilicon are described. However, the present invention is not limited thereto but is applicable to an apparatus and a method for etching another wiring layer, an aluminum-based alloy layer, a polyside layer or the like. The vacuum container which is made of aluminum in these embodiments is described but can be made of another metal, metal alloy, metal oxide such as aluminum oxide and/or metal nitride such as aluminum nitride. A chlorine gas is used as the etching gas in the embodiments. However, another gas such as another chlorine-based gas, a fluorine-based gas, a bromide-based gas or the like can be used as an etching gas. Further, an inert gas such as a nitrogen gas can be used as a process gas.

What is claimed is:

1. A plasma etching apparatus comprising:

a vacuum container having a processing chamber having a peripheral surface section therein in which a plasma is generated to etch a to-be-processed article;

a cathode electrode provided in said process chamber and supporting the to-be-processed article, the cathode electrode having an effective area exposed to the process chamber;

an anode electrode including an end surface section directly facing the cathode electrode and contiguously defining the process chamber with the peripheral surface section thereof, the anode electrode having an effective area exposed to said process chamber and made of a material of at least one of a metal, metal oxide, and metal nitride;

gas introducing means for introducing an etching gas into said process chamber; and power applying means for applying radio frequency electric power to said cathode electrode and producing plasma of said etching gas between said cathode electrode and said anode electrode in said process chamber, wherein an area ratio of said effective area of said anode electrode to said effective area of said cathode electrode is not more than 3.5 and where said material of the effective area of said anode electrode is sputtered by the plasma and is deposited on the article in an amount of $10^{14}$ or more atom/cm$^2$ during an etching of the article.

2. A plasma etching apparatus according to claim 1 wherein said anode electrode includes a ring member having a rim portion exposed to the interior of the process chamber, and the ring member is made of at least one of a metal, metal oxide and metal nitride, and is removably inserted in the process chamber.

3. A plasma etching apparatus according to claim 1 wherein said vacuum container includes an inner surface which is exposed to the process chamber and constitutes a portion of said effective area of the anode electrode.

4. A plasma etching apparatus according to claim 3 wherein said inner surface of the vacuum container includes the peripheral surface section and the end surface section facing the cathode electrode, and which further includes a cylindrical member having an inner surface exposed to the process chamber and made of at least one of a metal, metal oxide and metal nitride and removably inserted in the process chamber to cover the peripheral surface section, the effective area of the anode electrode being at least partially defined by the inner surface of the cylindrical member and the end surface section of the vacuum container.

5. A plasma etching apparatus according to claim 3, said inner surface of the vacuum container includes the peripheral surface section and the end surface section facing the cathode electrode, and which further includes a cylindrical member made of insulating material and removably inserted in the process chamber to cover the peripheral surface section, the effective area of the anode electrode being defined partly by the end surface section but not the peripheral surface section when the cylindrical member covers the peripheral surface section, and defined partly by the peripheral surface section and the end surface section when the cylindrical member does not cover the peripheral surface section.

6. A plasma etching apparatus according to claim 1, which further includes means for moving the cathode electrode to change the area of the effective area of the anode electrode.

7. A plasma etching apparatus comprising:

a vacuum container which is hermetically sealed;

a first electrode provided in said vacuum container and holding a to-be-processed article;

a process chamber having an inner peripheral surface and an article transferring section formed in said vacuum container and divided by said first electrode, said first electrode having an effective area exposed to the process chamber;

means for moving the first electrode between the process chamber and the article transferring section;

a second electrode having an effective area disposed at least partially opposite to said first electrode, and made of a material having at least one of a metal, metal oxide and metal nitride, the periphery of the portion of the second electrode opposite to said first electrode being sealed with the peripheral surface of the process chamber; and an electric power source for applying a radio frequency electric power between said first electrode and said second electrode and forming an etching gas introduced into said process chamber into plasma wherein an area ratio of said effective area of said second electrode and to said area of said first electrode is not more than 3.5 and wherein said material of the effective area of the second electrode is sputtered by the plasma and is deposited on the article in an amount of $10^{14}$ or more atoms/cm$^2$ during an etching of the article.

8. A plasma etching apparatus according to claim 7, wherein said effective area of the second electrode is made of at least one of aluminum, aluminum oxide and aluminum nitride.

9. A plasma etching apparatus according to claim 7, wherein said second electrode is constructed by the vacuum container which is electrically grounded.

10. A plasma etching apparatus according to claim 7, wherein said second electrode forms part of an inner wall of said process chamber.

11. A plasma etching apparatus according to claim 7, wherein a metallic cover is removably provided on said inner peripheral surface of said process chamber and is exposed to the process chamber to constitute a part of the second electrode.

12. A plasma etching apparatus according to claim 7, wherein said to-be-processed article has a silicon oxide layer as an underlying layer on which polysilicon is formed.

13. A plasma etching apparatus according to claim 7, wherein said first electrode is provided with coolant temperature controlling and coolant circulating means for regulating temperature of said first electrode.

14. A plasma etching apparatus according to claim 7, wherein the moving means relatively moves said first electrode and said second electrode so as to vary said area ratio in a range of not more than 3.5.

* * * * *